US012635310B2

(12) United States Patent
Kim et al.

(10) Patent No.: US 12,635,310 B2
(45) Date of Patent: May 19, 2026

(54) SEMICONDUCTOR LIGHT-EMITTING DEVICE SELF-ASSEMBLY APPARATUS TO SOLVE ASSEMBLY DEFECT GENERATED DURING SELF-ASSEMBLY

(71) Applicant: LG ELECTRONICS INC., Seoul (KR)

(72) Inventors: Jinsung Kim, Seoul (KR); Bongchu Shim, Seoul (KR); Dohee Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 855 days.

(21) Appl. No.: 17/798,812

(22) PCT Filed: Feb. 17, 2020

(86) PCT No.: PCT/KR2020/002192
§ 371 (c)(1),
(2) Date: Aug. 10, 2022

(87) PCT Pub. No.: WO2021/162152
PCT Pub. Date: Aug. 19, 2021

(65) Prior Publication Data
US 2023/0163248 A1    May 25, 2023

(30) Foreign Application Priority Data

Feb. 11, 2020    (KR) ........................ 10-2020-0016571

(51) Int. Cl.
*H10H 20/85*        (2025.01)
*H01L 25/075*       (2006.01)
*H10H 20/01*        (2025.01)

(52) U.S. Cl.
CPC ..... *H10H 20/8506* (2025.01); *H01L 25/0753* (2013.01); *H10H 20/01* (2025.01)

(58) Field of Classification Search
CPC .............. H01L 21/67144; H01L 21/68; H01L 21/6835; H01L 2221/68322;
(Continued)

(56) References Cited

U.S. PATENT DOCUMENTS 9,825,202 B2    11/2017  Schuele et al.
2018/0029038 A1*  2/2018  Sasaki ..................... H01L 24/00
(Continued)

FOREIGN PATENT DOCUMENTS

EP        3 872 846 A1      9/2021
EP        4 075 499 A1      10/2022
(Continued)

*Primary Examiner* — Minh N Trinh
(74) *Attorney, Agent, or Firm* — Birch, Stewart, Kolasch & Birch, LLP

(57)            ABSTRACT

Discussed is a self-assembly apparatus of a semiconductor light emitting diode. The self-assembly apparatus can include a fluid chamber including a space to accommodate a fluid and semiconductor light emitting diodes having a magnetic metal, a magnet to apply a magnetic force to the semiconductor light emitting diodes in a state where an assembly surface of a board is submerged in the fluid, a power supply portion to induce an electric field between assembly electrodes provided on the board so that the semiconductor light emitting diodes become seated at predetermined positions of the board while the semiconductor light emitting diodes are moved by a change in a position of the magnet, and a repair portion disposed in the fluid chamber and to separate some of the semiconductor light emitting diodes seated on the board from the board. The repair portion can be configured to spray and suction the fluid.

3 Claims, 19 Drawing Sheets

(58) Field of Classification Search
CPC . H01L 2221/68363; H01L 2221/68368; H01L
2224/95085; H01L 25/0753
See application file for complete search history.

(56) References Cited

U.S. PATENT DOCUMENTS

| | | | |
|---|---|---|---|
| 2021/0351158 A1 | 11/2021 | Choi et al. | |
| 2023/0059135 A1 | 2/2023 | Chang et al. | |
| 2023/0163248 A1* | 5/2023 | Kim ................... | H01L 25/0753 |
| | | | 257/79 |

FOREIGN PATENT DOCUMENTS

| | | | | |
|---|---|---|---|---|
| EP | 4105970 A1 * | 12/2022 | ......... | H01L 21/6835 |
| JP | 2008-525206 A | 7/2008 | | |
| KR | 10-2019-0085273 A | 7/2019 | | |
| KR | 10-2019-0118992 A | 10/2019 | | |
| KR | 10-2042179 B1 | 11/2019 | | |
| KR | 10-2019-0143840 A | 12/2019 | | |
| KR | 10-2020-0026689 A | 3/2020 | | |

* cited by examiner

SEMICONDUCTOR LIGHT-EMITTING DEVICE SELF-ASSEMBLY APPARATUS TO SOLVE ASSEMBLY DEFECT GENERATED DURING SELF-ASSEMBLY

CROSS REFERENCE TO RELATED APPLICATIONS

This application is the National Stage filing under 35 U.S.C. 371 of International Application No. PCT/KR2020/002192 filed on Feb. 17, 2020, which claims the benefit of earlier filing date and right of priority to Korean Application No. 10-2020-0016571, filed on Feb. 11, 2020, the contents of all these applications are hereby incorporated by reference herein in their entirety.

TECHNICAL FIELD

The present disclosure relates to a self-assembly apparatus and method for manufacturing a display device using a semiconductor light emitting diode having a size of several μm to several tens of μm.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED; uLED) having a cross-sectional area or diameter of 100 μm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in the fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of the micro LED is still insufficient. Accordingly, the present disclosure proposes a new type of manufacturing method and manufacturing apparatus capable of performing self-assembly of micro LEDs.

DISCLOSURE

Technical Problem

One object of the present disclosure is to provide a new manufacturing process having high reliability in a large-screen display using a micro-sized semiconductor light emitting diode.

Another object of the present disclosure is to provide a manufacturing process capable of improving transfer precision when self-assembling a semiconductor light emitting diode using a temporary board or a wiring board.

Another object of the present disclosure is to provide a manufacturing process that can effectively solve assembly defects generated during self-assembly.

Technical Solution

In order to achieve the above object, the present disclosure provides a self-assembly apparatus of a semiconductor light emitting diode which includes a fluid chamber including a space configured to accommodate a plurality of semiconductor light emitting diodes having a magnetic material and a fluid; a magnet configured to apply a magnetic force to the semiconductor light emitting diodes in a state where an assembly surface of a board is submerged in the fluid; a power supply portion configured to induce a formation of an electric field between assembly electrodes provided on the board so that the semiconductor light emitting diodes are seated at a predetermined position of the board while the semiconductor light emitting diodes are moved by a change in a position of the magnet; and a repair portion disposed in the fluid chamber and configured to separate some of the semiconductor light emitting diodes seated on the board from the board, in which the repair portion is configured to spray and suction the fluid.

In an embodiment, the repair portion may comprise a body portion, the body portion may include an upper surface disposed to face the assembly surface; a lower surface spaced apart from the upper surface; and a plurality of sidewalls disposed between the upper surface and the lower surface, and at least one hole may be formed in the upper surface.

In an embodiment, the repair portion may include a fluid controller configured to supply a fluid to an inner space of the body portion and suction the fluid filled in the space.

In an embodiment, the repair portion may include a position adjusting portion configured to move a position of the fluid controller; and a controller configured to control the position adjusting portion and the fluid controller.

In an embodiment, the controller may be configured to control the position adjusting portion so that the hole overlaps the semiconductor light emitting diode in which the assembly defect has occurred on the board; and control the fluid controller so that the fluid is suctioned into the inner space of the body portion in a state where the hole overlaps the semiconductor light emitting diode in which the assembly defect has occurred.

In an embodiment, the controller may be configured to control the fluid controller so that the fluid is suctioned into the inner space of the body portion until the semiconductor light emitting diode in which the assembly defect has occurred is adsorbed on the upper surface.

In an embodiment, the controller may be configured to, before the fluid is suctioned into the inner space of the body portion, control the position controller so that the hole overlaps another semiconductor light emitting diode adjacent to the semiconductor light emitting diode in which the assembly defect has occurred, and in a state where the hole overlaps the another semiconductor light emitting diode, control the fluid controller so that the fluid is sprayed through the hole.

In addition, the present disclosure provides a self-assembly method of a semiconductor light emitting diode which includes transferring a board so that an assembly surface of the board is submerged in a fluid accommodated in a fluid chamber; putting semiconductor light emitting diodes into the fluid chamber; applying a magnetic force to the semiconductor light emitting diodes so that the semiconductor light emitting diodes move in one direction in the fluid chamber; inducing the semiconductor light emitting diodes to predetermined positions by applying power to a plurality of electrodes disposed on the assembly surface of the board so that the semiconductor light emitting diodes are seated at the predetermined positions of the board while the semiconductor light emitting diodes are moved; and suctioning the fluid into a repair portion so that the semiconductor light emitting diode in which an assembly defect has occurred is separated from the board, in which the semiconductor light emitting diode in which the assembly defect has occurred includes a semiconductor light emitting diode that is not seated at the predetermined position.

In an embodiment, the step of suctioning the fluid into the repair portion may include transferring the repair portion so that a hole provided in the repair portion overlaps the semiconductor light emitting diode in which the assembly defect has occurred; and suctioning the fluid into the repair portion in a state where the hole overlaps the semiconductor light emitting diode in which the assembly defect has occurred.

In an embodiment, the self-assembly method of a semiconductor light emitting diode may further include, before the suctioning the fluid into the repair portion, transferring the repair portion so that the hole overlaps another semiconductor light emitting diode adjacent to the semiconductor light emitting diode in which the assembly defect has occurred; and in a state where the hole overlaps the another semiconductor light emitting diode, spraying the fluid through the hole.

Advantageous Effect

According to the present disclosure having the above configuration, in a display device in which individual pixels are formed of micro light emitting diodes, a large number of semiconductor light emitting diodes can be assembled at once.

As described above, according to the present disclosure, it is possible to pixelate a semiconductor light emitting diode in a large amount on a small-sized wafer and then transfer it to a large-area board. Through this, it is possible to manufacture a large-area display device at a low cost.

In addition, according to the manufacturing method and apparatus of the present disclosure, a semiconductor light emitting diode is transferred simultaneously and multiple times in place using a magnetic field and an electric field in a solution, thereby being capable of realizing low-cost, high-efficiency, and high-speed transfer regardless of the size, number, or transfer area of parts.

In addition, according to the manufacturing method and apparatus of the present disclosure, since assembly defects generated during self-assembly can be eliminated, the defect rate of the display device can be significantly reduced.

In addition, according to the present disclosure, the semiconductor light emitting diode that is incorrectly assembled is separated from the board by suctioning the fluid, and even if the semiconductor light emitting diode is separated from the board, the semiconductor light emitting diode is not damaged and can be recycled. In addition, according to the present disclosure, since the fluid suctioned into the repair portion has little effect on the board, there is no risk of damage to the board in the process of separating the semiconductor light emitting diode from the board.

In addition, according to the present disclosure, by spraying the fluid to the semiconductor light emitting diode disposed in the vicinity of the semiconductor light emitting diode in which the assembly defect has occurred, the semiconductor light emitting diode disposed in the vicinity of the semiconductor light emitting diode in which the assembly defect has occurred is strongly fixed to the board. Through this, the present disclosure can minimize the influence of the fluid suction of the repair portion.

DESCRIPTION OF DRAWINGS

FIGS. 8A to 8E are conceptual views illustrating a process of self-assembling a semiconductor light emitting diode using the self-assembly apparatus of FIG. 6.

BEST MODE

Figure 1:
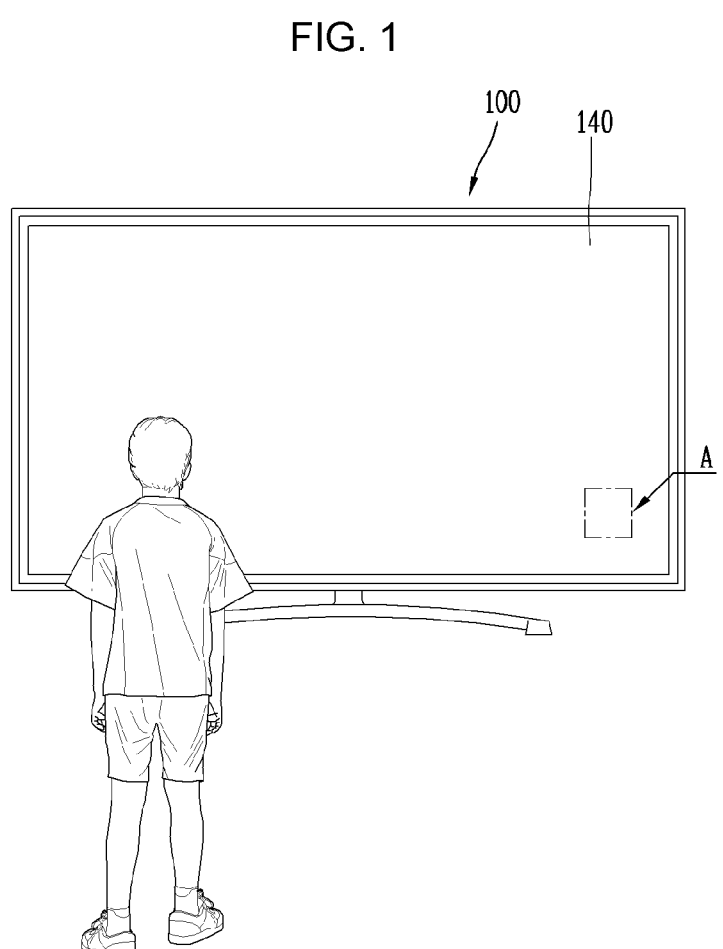
FIG. 1 is a conceptual diagram illustrating an embodiment of a display device using a semiconductor light emitting diode of the present disclosure.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments disclosed herein, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 2:
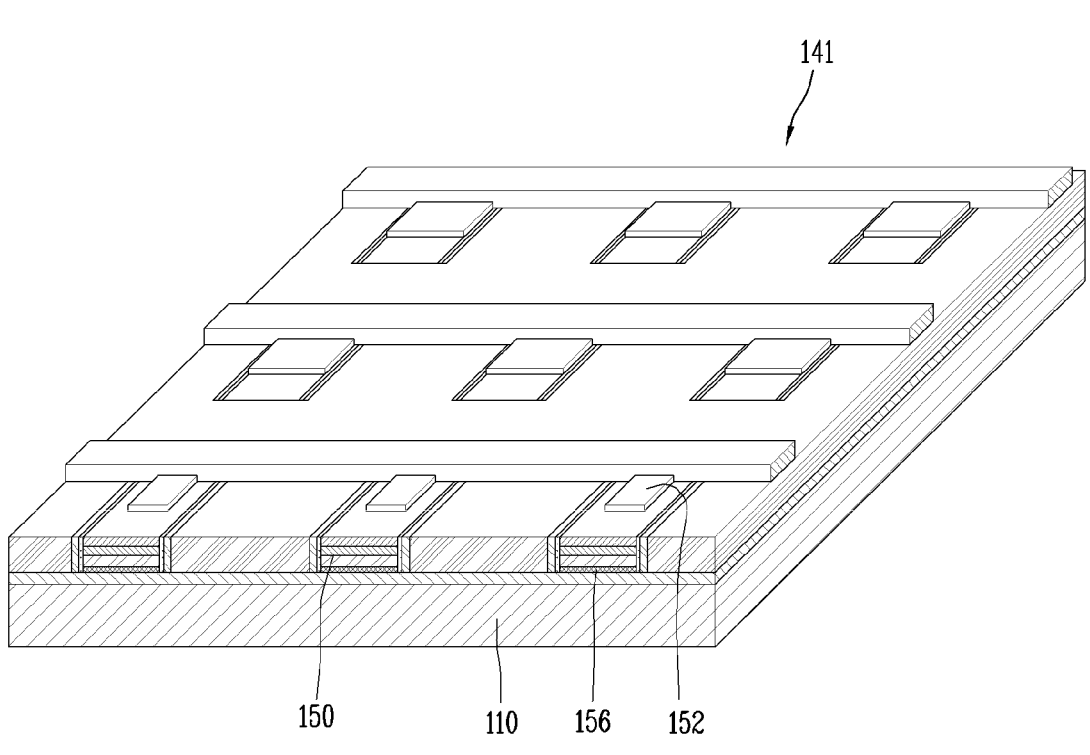
FIG. 2 is a partially enlarged view of portion A of the display device of FIG. 1.
Figure 3:
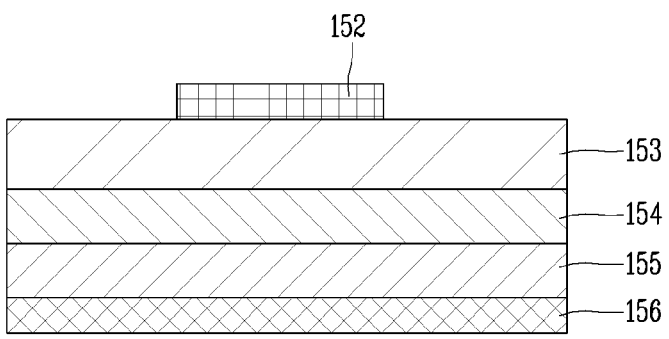
FIG. 3 is an enlarged view of the semiconductor light emitting diode of FIG. 2.
Figure 4:
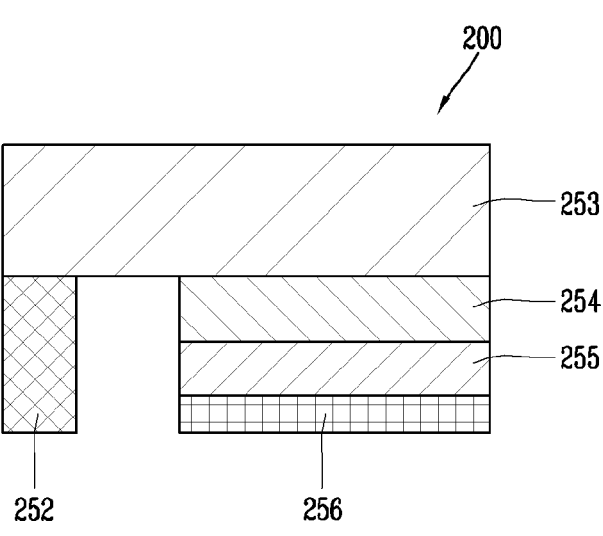
FIG. 4 is an enlarged view illustrating another embodiment of the semiconductor light emitting diode of FIG. 2.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
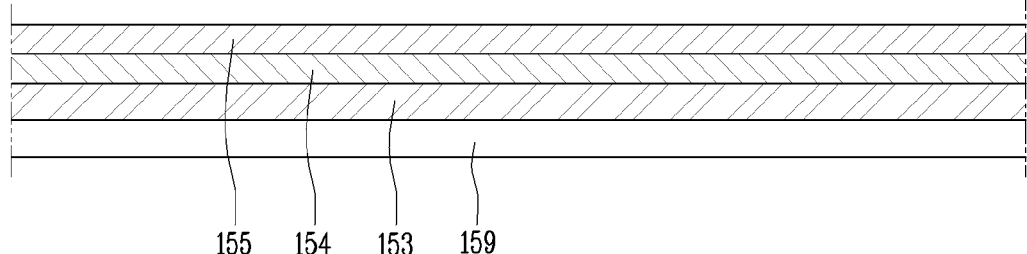
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O$_3$) board, or use at least one of Si, GaAs, GaP, InP, and Ga2O3.

Figure 5B:
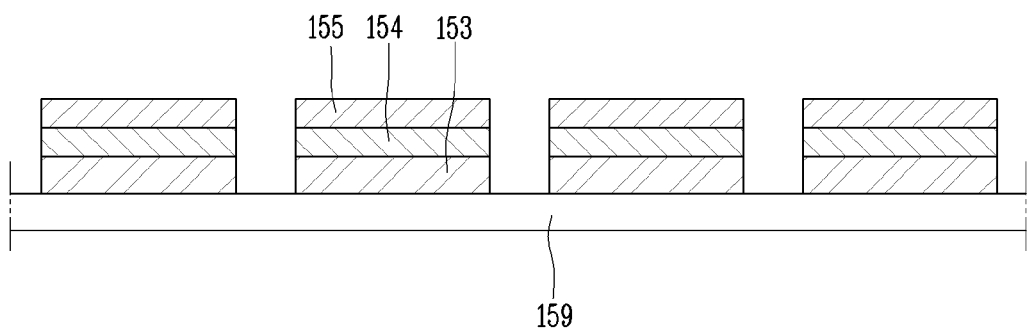

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
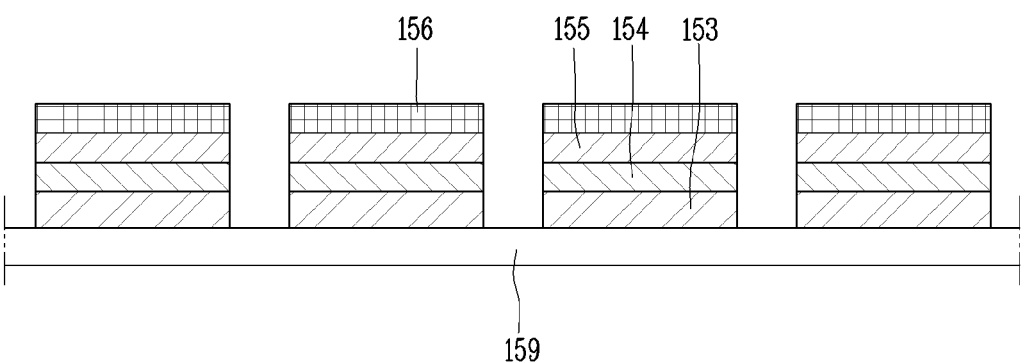

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Figure 5D:
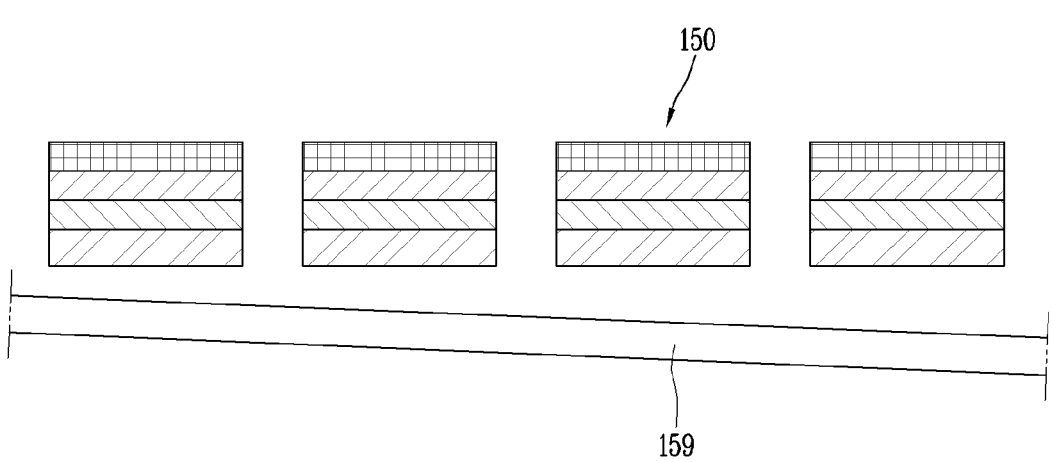

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
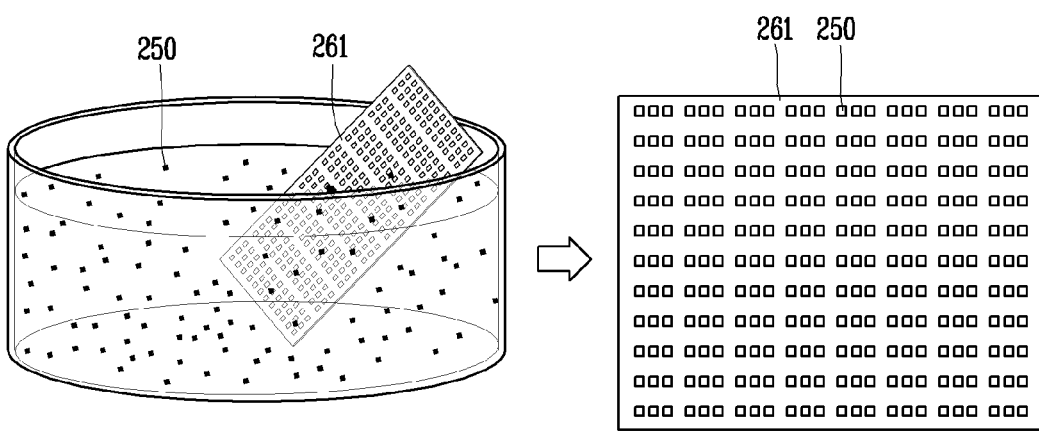

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
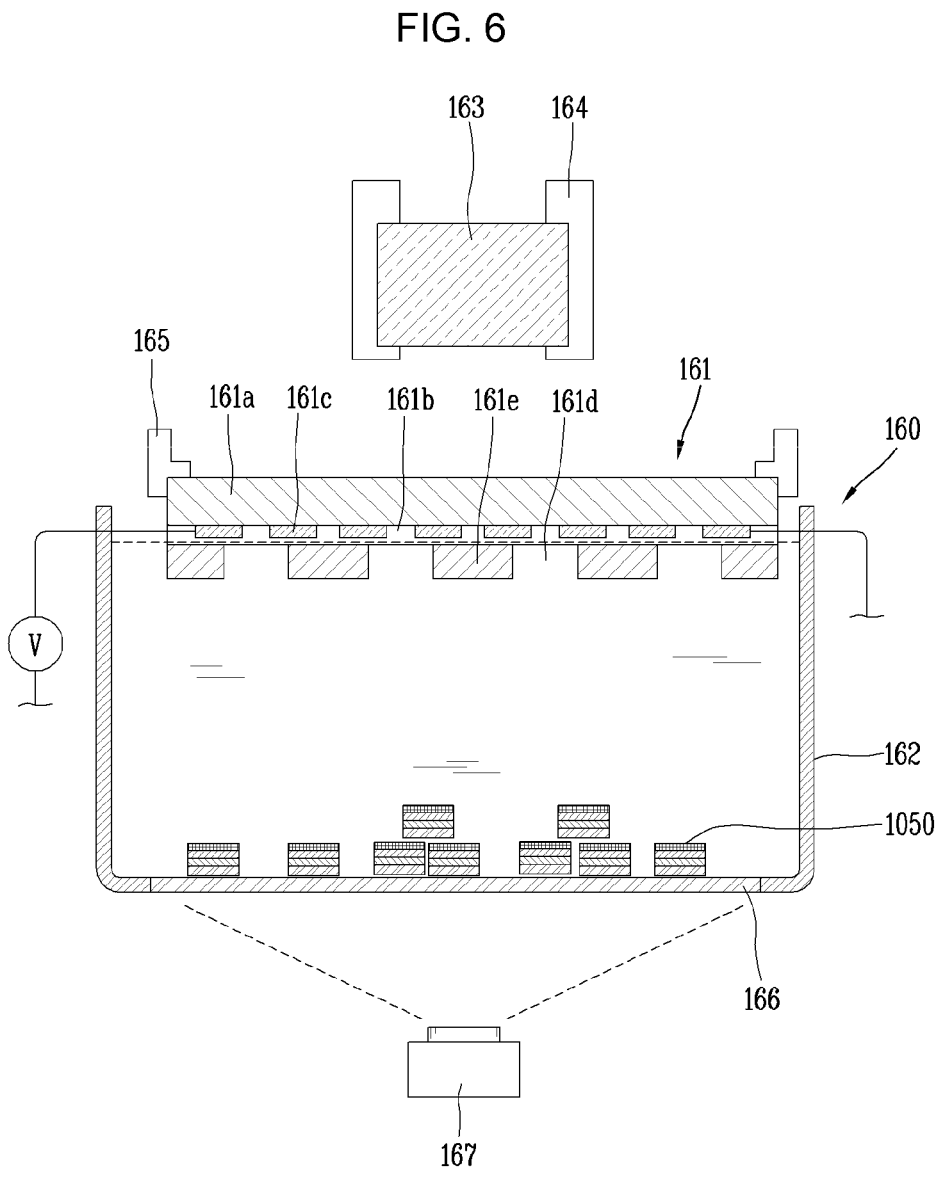
FIG. 6 is a conceptual diagram illustrating an example of a self-assembly apparatus of a semiconductor light emitting diode according to the present disclosure.
Figure 7:
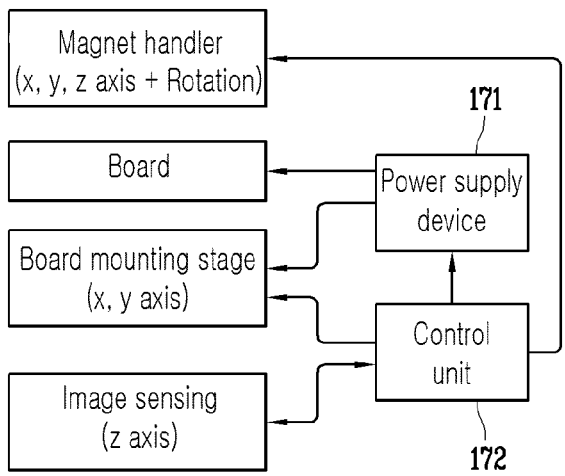
FIG. 7 is a block diagram of the self-assembly apparatus of FIG. 6.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
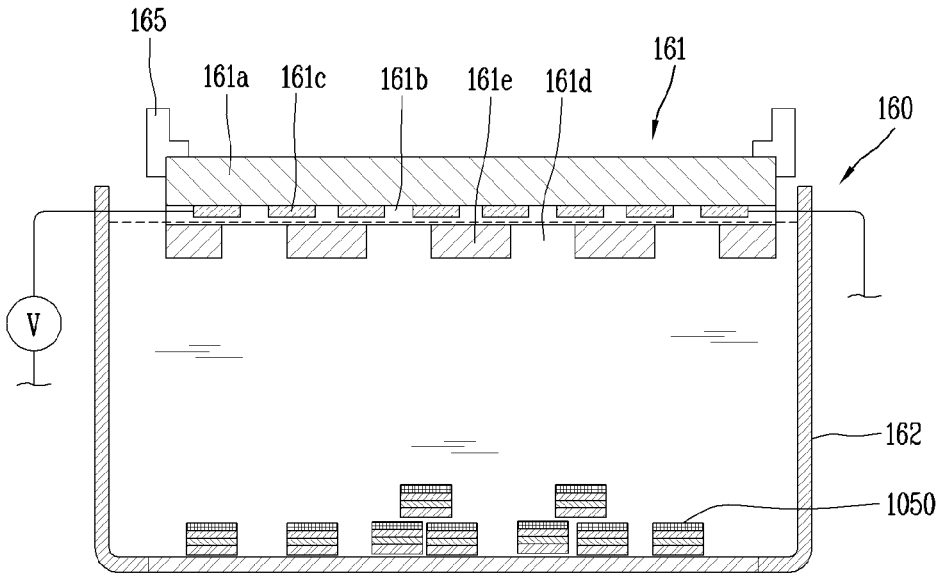
Figure 9:
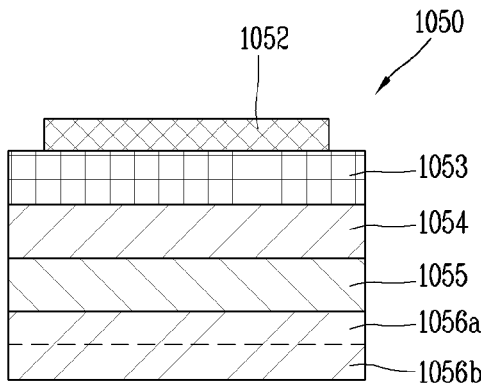
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
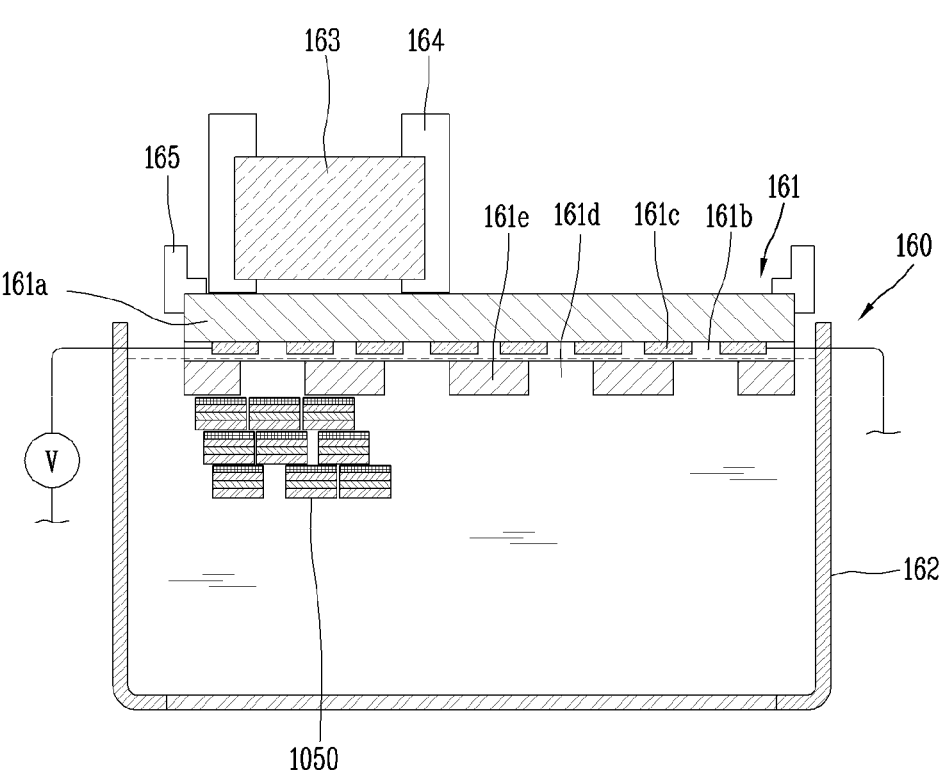

Next, a magnetic force is applied to the semiconductor light emitting diodes 1050 such that the semiconductor light emitting diodes 1050 vertically float in the fluid chamber 162 (FIG. 8B).

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
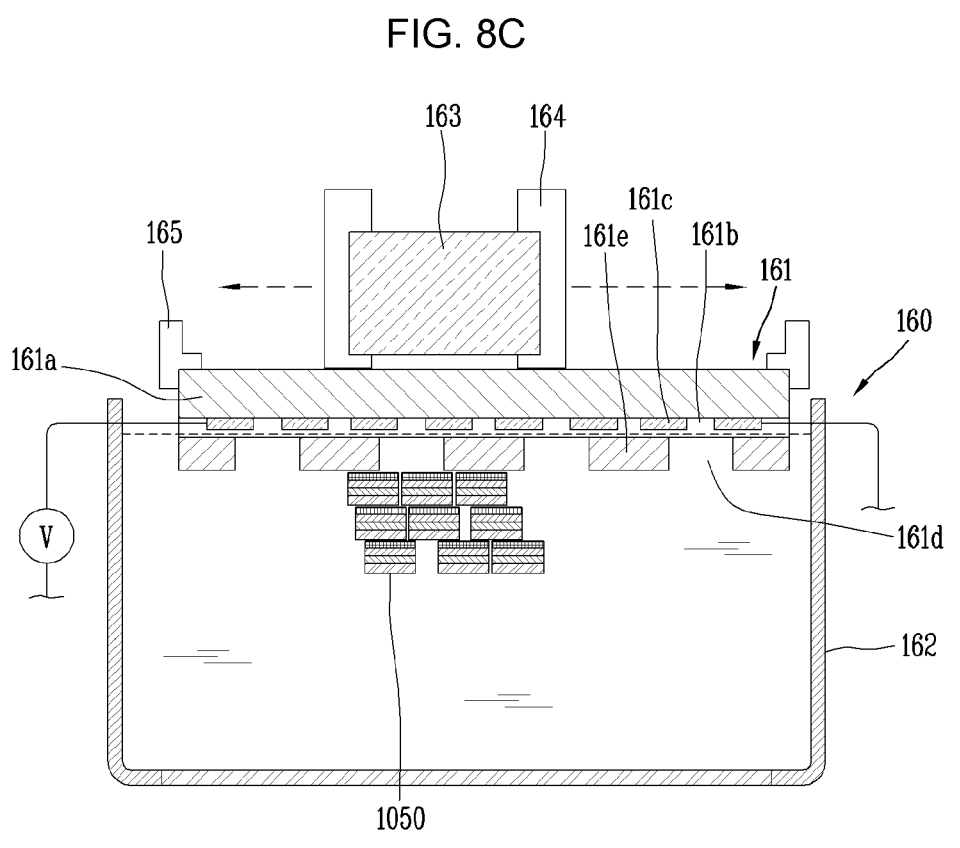

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Figure 8D:
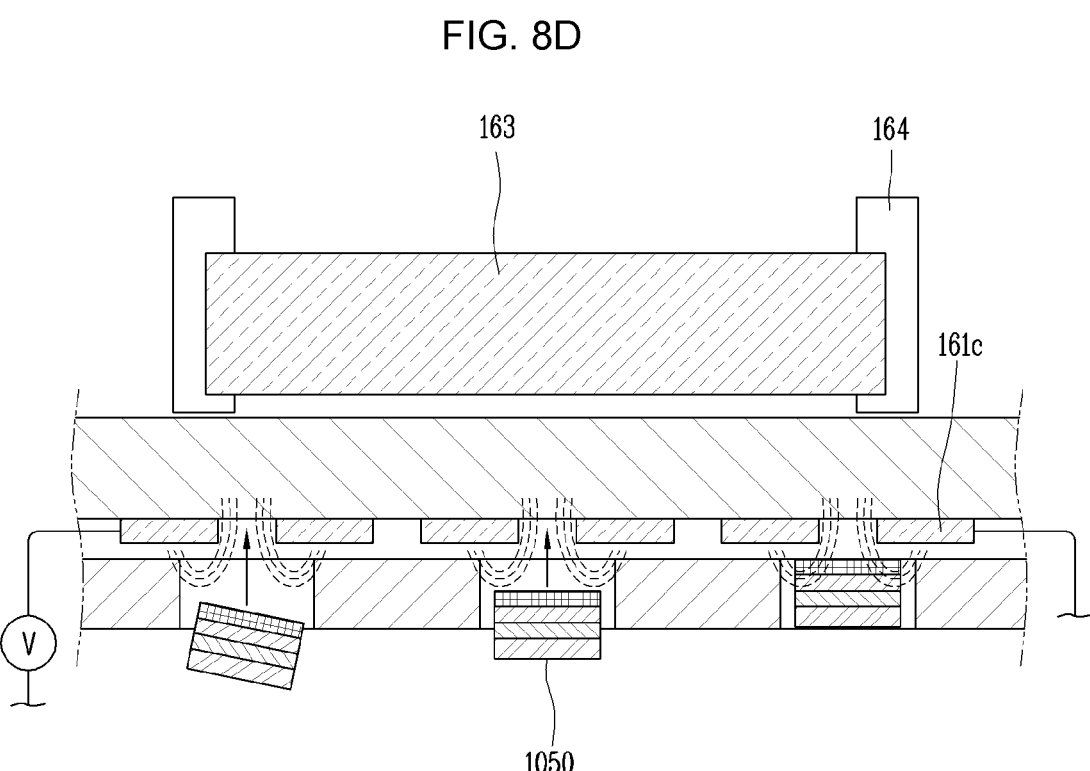

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Meanwhile, although the assembly accuracy of the self-assembly method described above is very high, the semiconductor light emitting diode may not be disposed at a predetermined position or may not be disposed in a designated orientation with a very low probability. In other words, assembly defects may occur with a very low probability in the self-assembly process.

In the case of a large-area display device, since hundreds or tens of millions of semiconductor light emitting diodes are transferred, the number of defective pixels becomes non-negligible even though the assembly defect probability is very low. For this reason, there is a need for a means capable of resolving assembly defects after self-assembly.

The present disclosure provides an apparatus and method capable of resolving assembly defects after self-assembly. The present disclosure further includes a repair portion in the self-assembly apparatus described above.

First, the structure of the repair portion will be described, but the structure to be described below is only an example of the repair portion according to the present disclosure, and the structure of the repair portion is not limited thereto.

Figure 10:
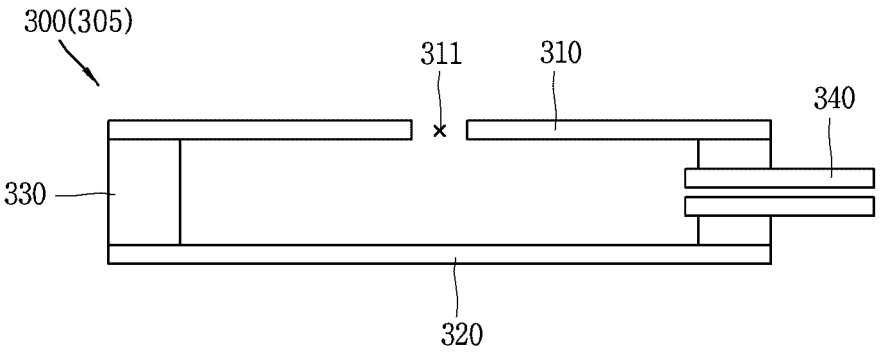
FIGS. 10 and 11 are cross-sectional views of a repair portion according to an embodiment of the present disclosure.
Figure 11:
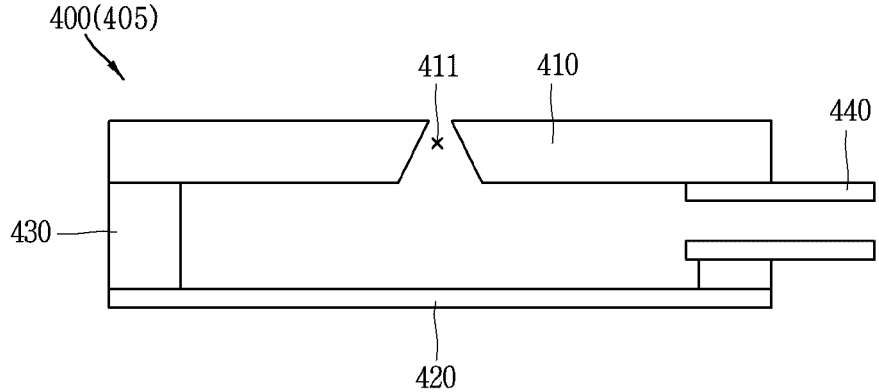
Figure 12:
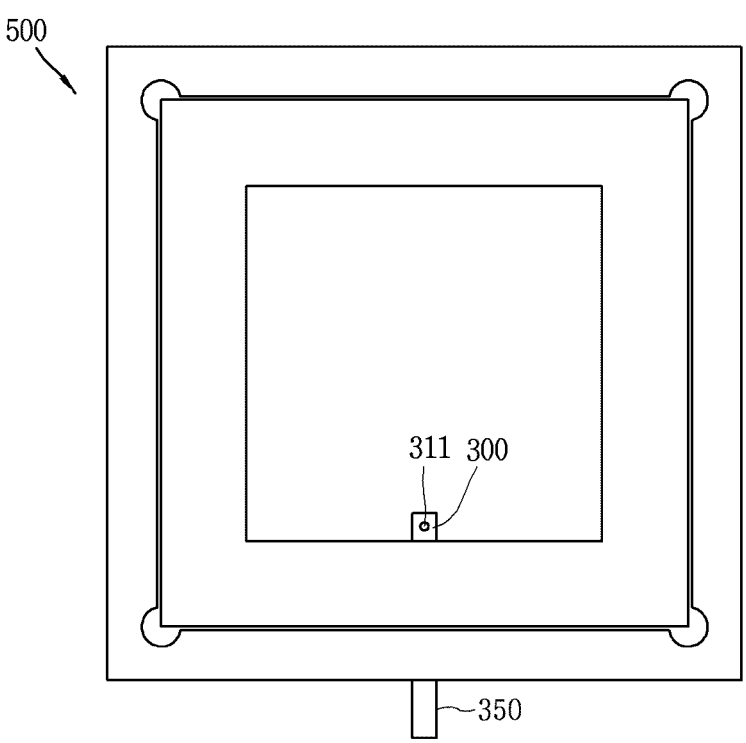
FIG. 12 is a conceptual diagram illustrating a state where the repair portion according to the present disclosure is viewed from the bottom plate of the fluid chamber.

FIGS. 10 and 11 are cross-sectional views of a repair portion according to an embodiment of the present disclosure, and FIG. 12 is a conceptual diagram illustrating a state where the repair portion according to the present disclosure is viewed from the bottom plate of the fluid chamber.

Referring to FIG. 10 and FIG. 11, the repair portion 300, 400 includes a body portion 305, 405. The body portion 305, 405 may include an upper surface 310, 410, a lower surface 320, 420, and a plurality of sidewalls 330, 430. Meanwhile, at least one hole 311, 411 may be formed in the upper surface 310, 410. The below discussion of FIG. 10 applies to like elements of FIG. 11.

In the present specification, a space surrounded by the upper surface 310, the lower surface 320, and the plurality of side walls 330 is defined as an inner space of the body portion. The fluid flows into the inner space of the body portion or is discharged to the outside of the body portion, through the hole. Here, the fluid flows in toward the hole 311 or is ejected in a direction the hole 311 faces.

Here, the upper surface of the repair portion may be made of glass as shown in FIG. 10 or made of a silicone material as shown in FIG. 11, but is not limited thereto.

The hole may be formed in any one of a circular shape and a slit shape, but is not limited thereto.

Meanwhile, the repair portion 300, 400 according to the present disclosure includes a fluid controller 340, 440. The fluid controller 340, 440 is configured to supply fluid to the inner space of the body portion and suction the fluid filled in the space.

An embodiment in which the fluid controller 340 suctions the fluid will first be described. The fluid controller 340 suctions the fluid filled in the space so that a portion of the fluid accommodated in the fluid chamber is suctioned into the body portion through the hole 311. When the body portion suctions the fluid in a state where the body portion is disposed at a position sufficiently close to the semiconductor light emitting diode, a suction force acts on the semiconductor light emitting diode. Accordingly, the semiconductor light emitting diode to which the suction force acts is moved in the direction of the body portion. This will be described below.

Meanwhile, the fluid controller 340 is configured to supply a fluid into the body portion. The fluid controller 340 supplies a fluid to the inner space of the body portion so that a portion of the fluid accommodated in the body portion is ejected to the outside of the body portion through the hole 311. When the body portion ejects a fluid while the body portion is disposed sufficiently close to the semiconductor light emitting diode, the ejected fluid may affect the semiconductor light emitting diode. An effect of the fluid on the semiconductor light emitting diode may vary according to a relative position between the hole and the semiconductor light emitting diode. This will be described below.

However, the fluid should be selectively sprayed onto any one of the semiconductor light emitting diodes assembled at intervals of less than 500 μm. For this reason, the size of the hole 311 should be very small. Specifically, the diameter of the hole 311 is preferably formed within several tens of μm. Meanwhile, a distance between the board and the bottom plate of the fluid chamber may be very narrow. In an embodiment, a distance between the board and the bottom plate may be 2 mm.

The repair portion 300 should be able to move forward, backward, left and right in the space. To this end, the present disclosure may further include a position adjusting portion 350 for allowing the repair portion 300 to move between the assembly surface of the board and the bottom plate.

As shown in FIG. 12, when the bottom plate of the fluid chamber 500 is made of a light-transmitting material, the position of the repair portion 300 may be checked in real time. Through this, the position of the repair portion 300 of the present disclosure can be precisely adjusted. However, FIG. 12 is a diagram for better understanding, and in fact, the hole provided in the repair portion 300 is disposed to face the board, not the bottom plate.

Meanwhile, whether or not an assembly defect has occurred and the location of the occurrence may be detected through the monitoring result of the image sensor. The position adjusting portion moves the position of the repair portion so that the hole of the repair portion faces the location where the assembly defect has occurred.

The self-assembly apparatus according to the present disclosure may include a controller configured to control the position adjusting portion and the fluid controller 340. The controller may be the same controller as the controller 172 described with reference to FIG. 7 or a separately provided controller. In this specification, the controller configured to control the position adjusting portion and the fluid controller 340 and the controller 172 described with reference to FIG. 7 are not distinguished, but the two controllers are not necessarily the same controller.

The fluid may be the same material as the fluid in the fluid chamber, but is not limited thereto. In an embodiment, the fluid may be water.

After self-assembly, the repair portion 300 is used to separate the semiconductor light emitting diodes in which the assembly defect has occurred among the semiconductor light emitting diodes seated on the board from the board. However, the semiconductor light emitting diode separated from the board by the repair portion 300 is not limited to the semiconductor light emitting diode in which the assembly defect has occurred. For example, even a semiconductor light emitting diode in which some of the normally assembled semiconductor light emitting diodes are damaged may be separated from the board by the repair portion 300.

Hereinafter, a type in which the assembly defect has occurred will be described.

FIGS. 13A to 13D are conceptual views illustrating types of semiconductor light emitting diodes mounted on a board.

Figure 8E:
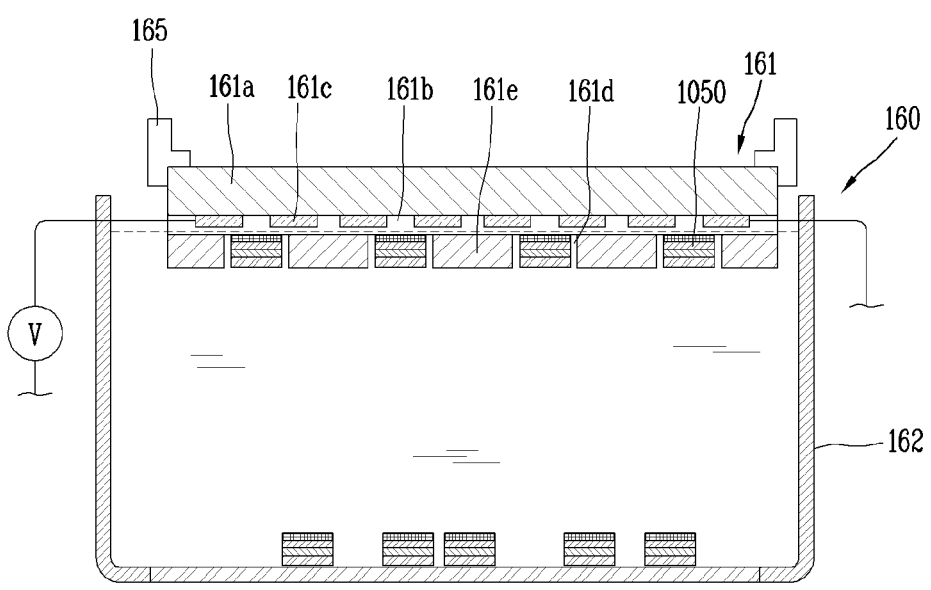

When the step described with reference to FIG. 8E is finished, some of the semiconductor light emitting diodes put into the fluid are affected by the magnetic field formed in the board to be seated on the board. In order not to cause assembly defects, the semiconductor light emitting diode should be seated at a predetermined position on the board, and a predetermined surface of the semiconductor light emitting diode should be disposed to face the board. In the present specification, one surface of the semiconductor light emitting diode to be disposed to face the board during self-assembly is referred to as a first surface. Alternatively, a surface opposite to the first surface is referred to as a second surface.

Figure 13A:
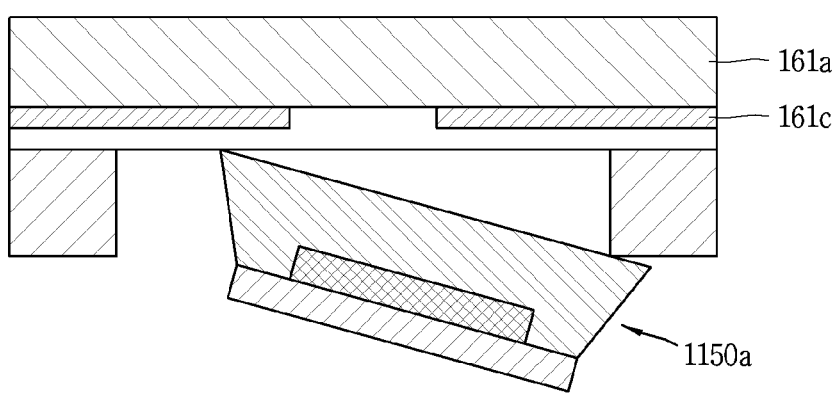
FIGS. 13A to 13D are conceptual views illustrating types of semiconductor light emitting diodes mounted on a board.

Referring to FIG. 13A, the first surface of the semiconductor light emitting diode 1150a seated on the board may be disposed at an angle to the assembly surface of the board. In this case, it becomes difficult to form a wiring electrode for supplying power to the semiconductor light emitting diode 1150a. In addition, there is a high possibility that the semiconductor light emitting diode 1150a is separated from the board in a later process. Accordingly, the disposition of the semiconductor light emitting diode according to FIG. 13A corresponds to one type of assembly defect.

Figure 13B:
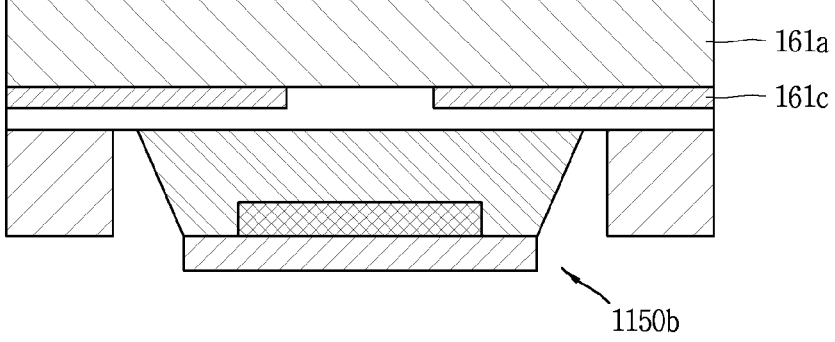

Meanwhile, referring to FIG. 13B, the semiconductor light emitting diode 1150b seated on the board may be disposed at a predetermined position on the board, and a first surface of the semiconductor light emitting diode 1150b may be disposed to face the board. Accordingly, the disposition of the semiconductor light emitting diode according to FIG. 13B corresponds to a normal disposition. The semiconductor light emitting diode seated on the board should have a disposition as shown in FIG. 13B.

Figure 13C:
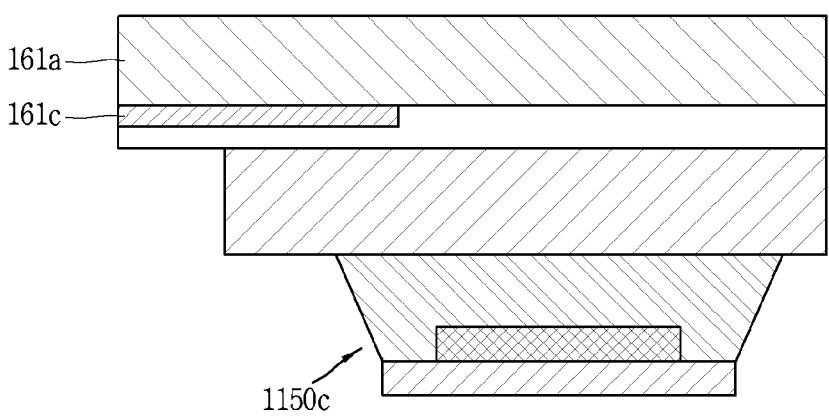

Meanwhile, referring to FIG. 13C, the semiconductor light emitting diode 1150c seated on the board may not be disposed at a predetermined position on the board. In this case, it is difficult to form a wiring electrode for supplying power to the semiconductor light emitting diode 1150c, and it is difficult to form a pixel at a designated position. Accordingly, the disposition of the semiconductor light emitting diode according to FIG. 13C corresponds to one type of assembly defect.

Figure 13D:
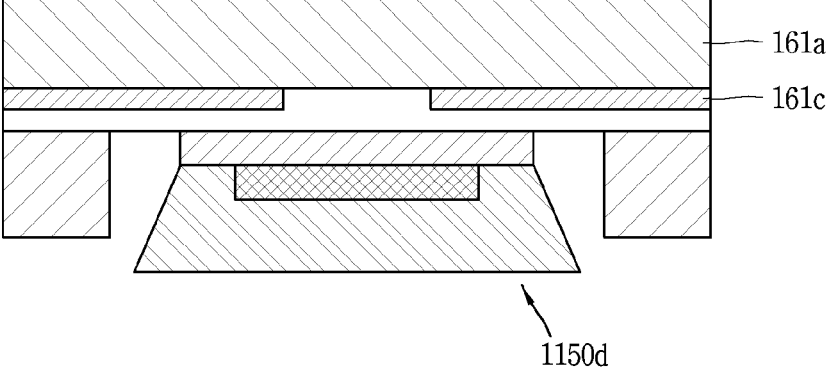

Finally, referring to FIG. 13D, the second surface of the semiconductor light emitting diode 1150d seated on the board may be disposed to face the board. In this case, the wiring electrode cannot be connected to the semiconductor light emitting diode 1150d. Accordingly, the disposition of the semiconductor light emitting diode according to FIG. 13D corresponds to one type of assembly defect.

As described above, various types of assembly defects may occur in the semiconductor light emitting diode mounted on the board. FIGS. 13A, 13C, and 13D only show an example of an assembly defect, and the drawings do not limit the type of assembly defect. A structure other than the structure described with reference to FIG. 13B may be defined as an assembly defect.

The repair portion 300 according to the present disclosure allows the semiconductor light emitting diode having an assembly defect to be separated from the board.

Hereinafter, a self-assembly method of the semiconductor light emitting diode using the repair portion will be described.

Figure 14A:
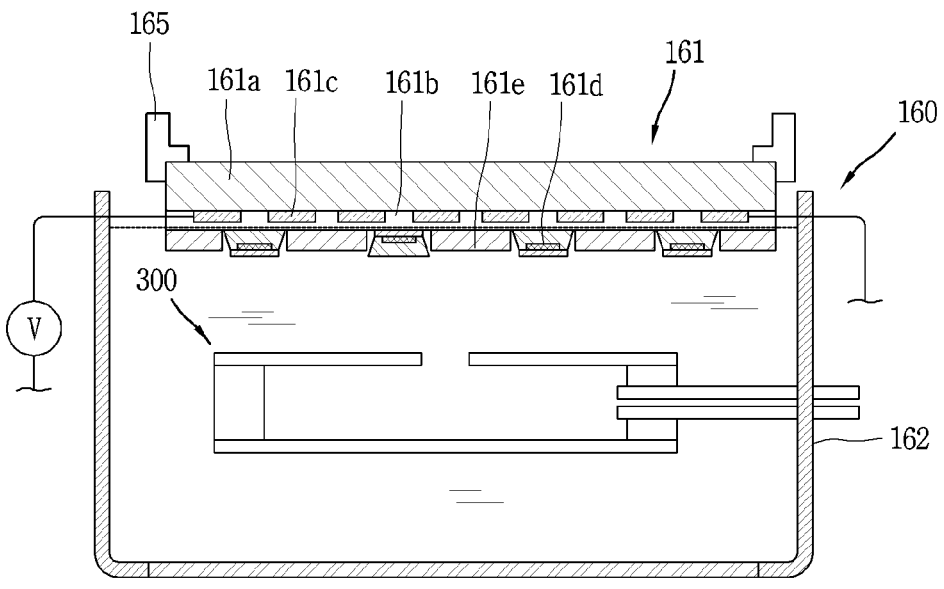
FIGS. 14A to 14D are conceptual views illustrating a self-assembly method using a repair portion.
Figure 14B:
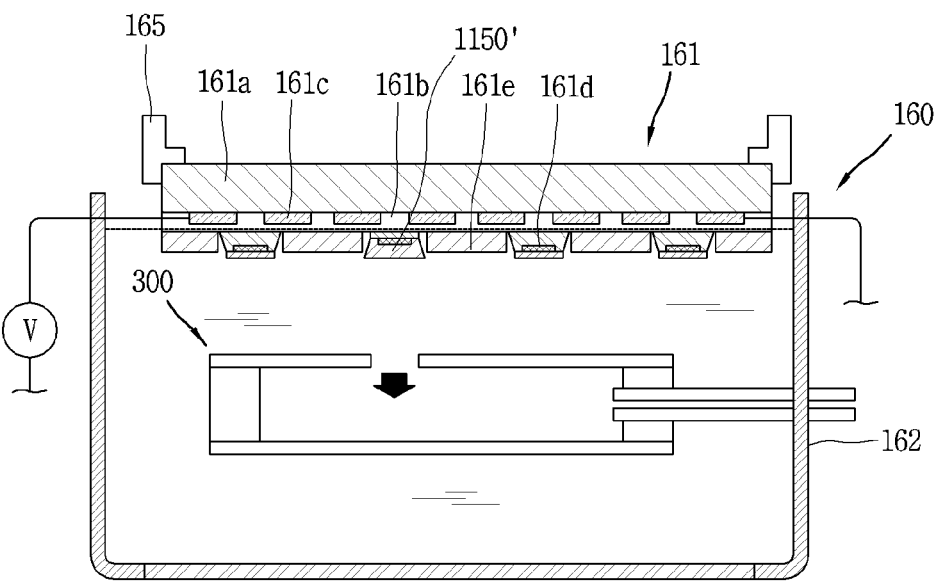
Figure 14C:
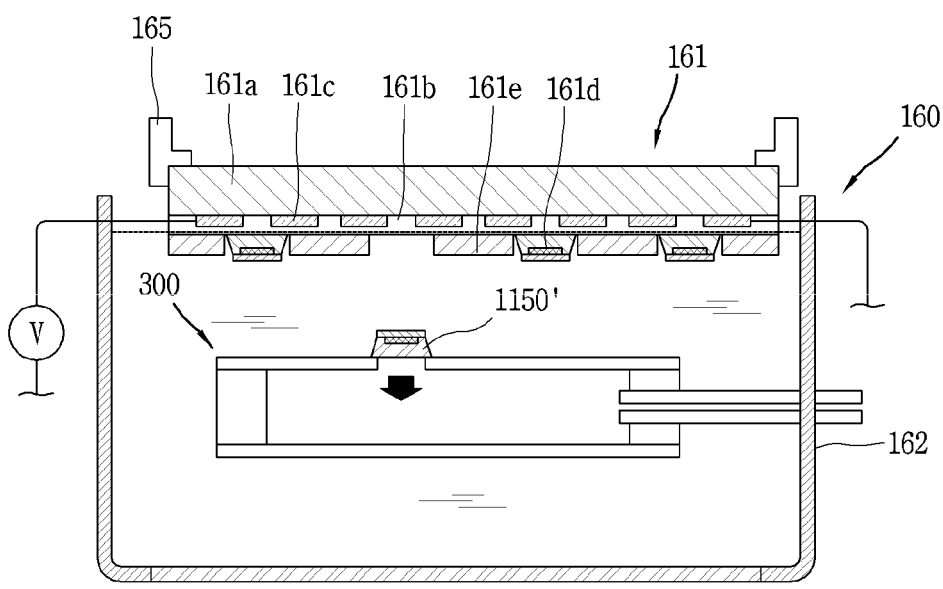

FIGS. 14A to 14C are conceptual views illustrating a self-assembly method using a repair portion.

First, the self-assembly method described with reference to FIGS. 8A to 8E is performed.

Thereafter, a step of suctioning a fluid into the repair portion in the fluid chamber is performed so that the semiconductor light emitting diode in which the assembly defect has occurred on the board is separated from the board.

Referring to FIG. 14A, after the self-assembly described with reference to FIGS. 8A to 8E is finished, assembly defects may occur in some semiconductor light emitting diodes. The position adjusting portion moves the repair portion so that the hole 311 of the repair portion 300 overlaps the semiconductor light emitting diode in which the assembly defect has occurred. However, the hole does not necessarily overlap the semiconductor light emitting diode in which the assembly defect has occurred.

Next, referring to FIG. 14B, in a state where the hole 311 is sufficiently adjacent to the semiconductor light emitting diode 1150' in which the assembly defect has occurred, a step of suctioning the fluid through the hole 311 by the repair portion 300 is performed. When the fluid is suctioned, care must be taken not to affect the normally assembled semiconductor light emitting diodes. A method of minimizing the influence of the surrounding by fluid suction will be described below.

Meanwhile, referring to FIG. 14C, the controller controls the fluid controller 340 so that the fluid is suctioned into the inner space of the body portion until the semiconductor light emitting diode 1150 ' in which the assembly defect has occurred is adsorbed on the upper surface of the body portion. The semiconductor light emitting diode 1150' in which the assembly defect has occurred is adsorbed to the body portion while overlapping the hole. In this state, when the fluid controller 340 additionally suctions the fluid, the semiconductor light emitting diode in which the assembly defect has occurred may be strongly fixed on the body portion. In this state, the controller transfers the repair portion 300 to recover the semiconductor light emitting diode in which the assembly defect has occurred. The recovered semiconductor light emitting diode may be recycled for self-assembly or disposed of.

Meanwhile, the repair portion 300 may be used in a state where an electric field is formed on the board. Accordingly, an electric force acts on the semiconductor light emitting diode seated on the board. The repair portion should suction the fluid so that a suction force sufficient to offset the electric force acts.

Meanwhile, some semiconductor light emitting diodes separated from the board by the repair portion 300 may be semiconductor light emitting diodes in which the assembly defect has occurred or damaged semiconductor light emitting diodes. As described in FIGS. 13A to 13D, the semiconductor light emitting diode in which the assembly defect has occurred may be at least one of a semiconductor light emitting diode that is not seated in a predetermined position, a semiconductor light emitting diode disposed having a second surface facing the board, and a light emitting device having a first surface disposed at an angle to the board.

Figure 14D:
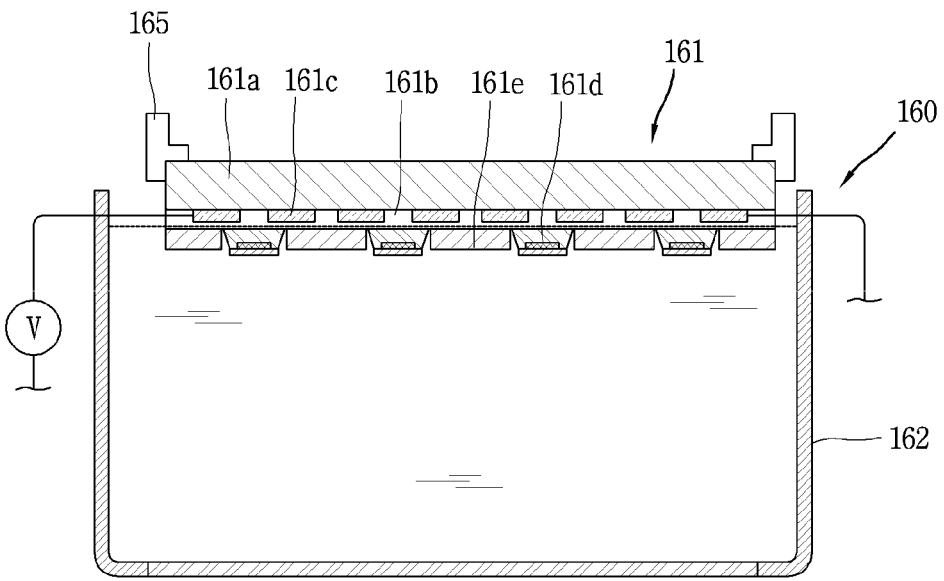

Meanwhile, when some of the semiconductor light emitting diodes are separated from the board, the positions of the some of the semiconductor light emitting diodes are left as empty spaces. The processes of FIGS. 8A to 8E may be performed once more so that a new semiconductor light emitting diode is seated in the empty space. As a result, all of the semiconductor light emitting diodes are disposed in a predetermined positions and orientation as shown in FIG. 14D.

According to the present disclosure, since the incorrectly assembled semiconductor light emitting diode is separated from the board by suctioning the fluid, even if the semiconductor light emitting diode is separated from the board, the semiconductor light emitting diode is not damaged and can be recycled. In addition, according to the present disclosure, since the fluid suctioned into the repair portion has little influence on the board, there is no risk of damage to the board in the process of separating the semiconductor light emitting diode from the board.

Meanwhile, the present disclosure provides a method of minimizing the influence of the surrounding by the fluid suction of the repair portion.

Figure 15:
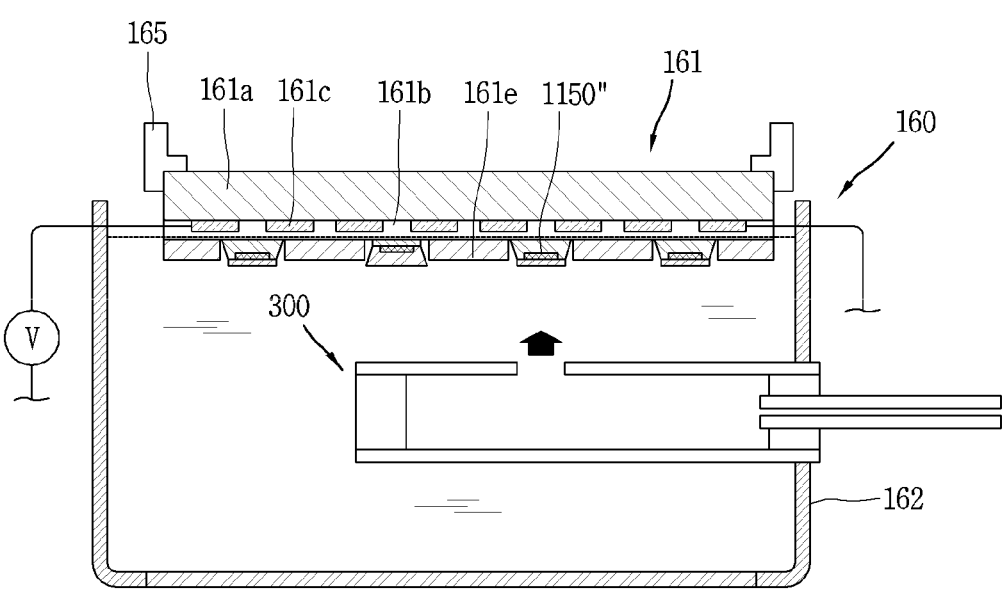
FIGS. 15 and 16 are conceptual views illustrating a method of minimizing the influence of the surrounding by the fluid suction of the repair portion.
Figure 16:
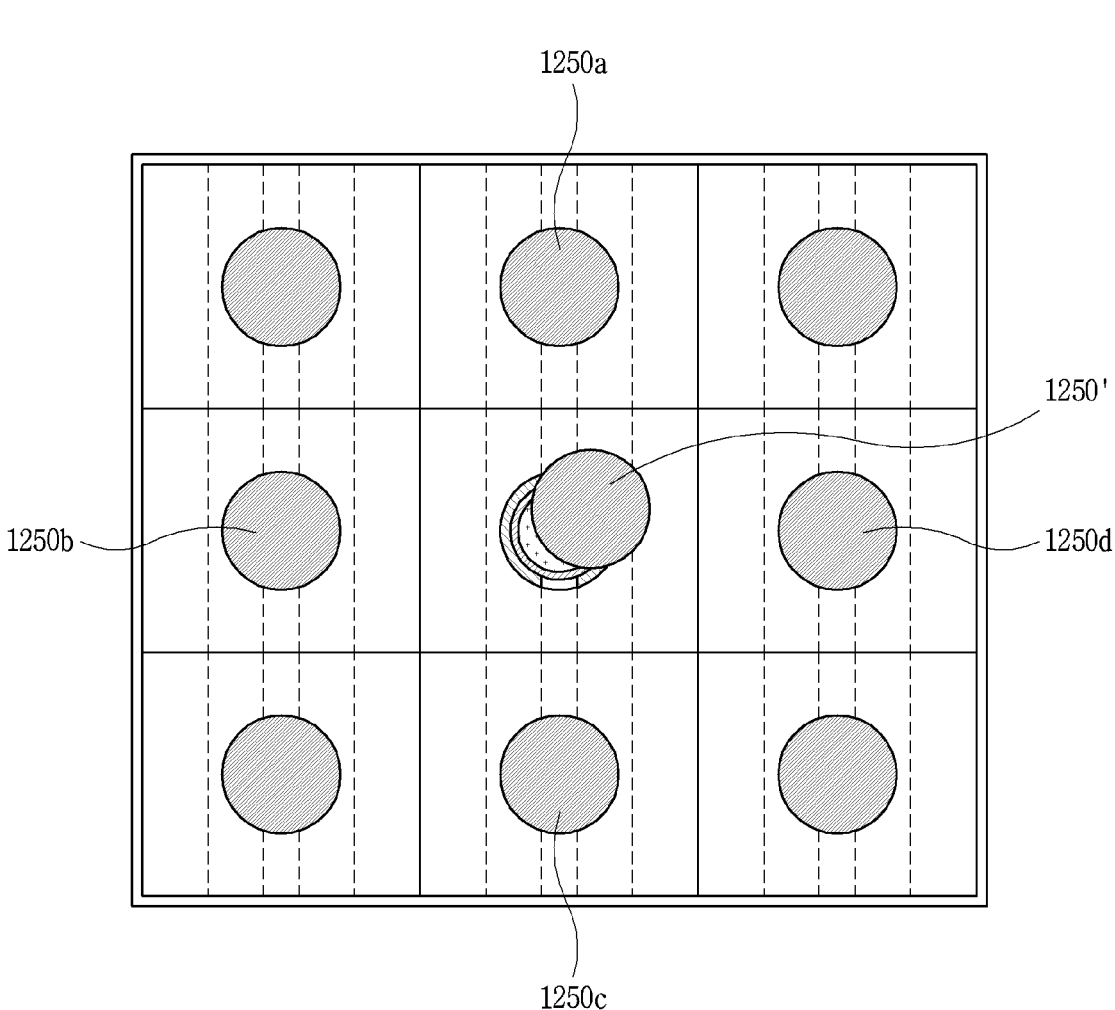

FIGS. 15 and 16 are conceptual views illustrating a method of minimizing the influence of the surrounding by the fluid suction of the repair portion.

Specifically, referring to FIG. 15, in the present disclosure, before the fluid is suctioned through the repair portion 300, using the repair portion 300 the semiconductor light emitting diodes normally assembled are strongly fixed on the board. The controller controls the position adjusting portion so that the hole overlaps the other semiconductor light emitting diode 1150" adjacent to the semiconductor light emitting diode in which the assembly defect has occurred before the fluid is suctioned into the inner space of the body portion.

In a state where the hole overlaps the other semiconductor light emitting diode, the fluid controller 340 is controlled so that the fluid is sprayed through the hole. Thereafter, the controller controls the fluid controller 340 so that the fluid is sprayed through the hole while the hole overlaps the other semiconductor light emitting diode 1150". In this case, it is preferable that the hole and the other semiconductor light emitting diode 1150" completely overlap.

When the fluid is sprayed in a state where the hole and the other semiconductor light emitting diode 1150" completely overlap, the fluid is vertically sprayed to the other semiconductor light emitting diode 1150". In this case, the sprayed fluid does not separate the other semiconductor light emitting diode 1150" from the board, but strongly fixes the other semiconductor light emitting diode 1150" to the board. When the fluid is sprayed on the semiconductor light emitting diodes surrounding the semiconductor light emitting diode in which the assembly defect has occurred, the surrounding semiconductor light emitting diodes are strongly fixed to the board, so that the influence of fluid suction can be minimized.

In one embodiment, referring to FIG. 16, based on the semiconductor light emitting diode 1250' in which the assembly defect has occurred, the fluid is sprayed onto the semiconductor light emitting diodes 1250a to 1250d disposed on the top, bottom, left and right sides, and thus the semiconductor light emitting diodes 1250a to 1250d may be strongly fixed on the board. Through this, the present disclosure minimizes the influence of fluid suction.

As described above, according to the present disclosure, by spraying a fluid to the semiconductor light emitting diode disposed around the semiconductor light emitting diode in which the assembly defect has occurred, the semiconductor light emitting diode disposed around the semiconductor light emitting diode in which the assembly defect has occurred is strongly fixed on the board. Through this, the present disclosure can minimize the influence of the fluid suction of the repair portion.

The invention claimed is:

1. A self-assembly apparatus of a semiconductor light emitting diode, the self-assembly apparatus comprising:

a fluid chamber including a space configured to accommodate a fluid and a plurality of semiconductor light emitting diodes having a magnetic metal;

a magnet configured to apply a magnetic force to the plurality of semiconductor light emitting diodes in a state where an assembly surface of a board is submerged in the fluid;

a power supply portion configured to induce an electric field between assembly electrodes provided on the board so that the plurality of semiconductor light emitting diodes become seated at predetermined positions of the board while the plurality of semiconductor light emitting diodes are moved by a change in a position of the magnet; and a repair portion disposed in the fluid chamber, wherein the repair portion comprises a body portion, wherein the body portion includes:

an upper surface disposed to face the assembly surface of the board;

a lower surface spaced apart from the upper surface; and a plurality of sidewalls disposed between the upper surface and the lower surface, wherein at least one hole is formed in the upper surface, wherein the repair portion includes a fluid controller configured to supply the fluid to an inner space of the body portion and suction the fluid in the inner space, wherein the repair portion further includes:

a position adjusting portion configured to move a position of the fluid controller; and a controller configured to control the position adjusting portion and the fluid controller, and wherein the controller is configured to:

control the position adjusting portion so that the at least one hole overlaps a semiconductor light emitting diode in which an assembly defect has occurred from among the plurality of semiconductor light emitting diodes on the board; and control the fluid controller so that the fluid is suctioned into the inner space of the body portion in a state where the at least one hole overlaps the semiconductor light emitting diode in which the assembly defect has occurred.

2. The self-assembly apparatus of a semiconductor light emitting diode of claim 1, wherein the controller is configured to control the fluid controller so that the fluid is suctioned into the inner space of the body portion until the semiconductor light emitting diode in which the assembly defect has occurred is adsorbed on the upper surface of the body portion.

3. The self-assembly apparatus of a semiconductor light emitting diode of claim 1, wherein the controller is configured to, before the fluid is suctioned into the inner space of the body portion, control the position adjusting portion so that the at least one hole overlaps another semiconductor light emitting diode that is adjacent to the semiconductor light emitting diode in which the assembly 5 defect has occurred from among the plurality of semiconductor light emitting diodes, and in a state where the hole overlaps the another semiconductor light emitting diode, control the fluid controller so that the fluid is sprayed through the at least one hole. 10

* * * * *